(12) United States Patent
Koyanagi

(10) Patent No.: US 11,785,728 B2
(45) Date of Patent: Oct. 10, 2023

(54) ELECTRIC POWER DEVICE

(71) Applicant: TOYOTA JIDOSHA KABUSHIKI KAISHA, Toyota (JP)

(72) Inventor: Hirotaka Koyanagi, Yokohama (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/726,782

(22) Filed: Apr. 22, 2022

(65) Prior Publication Data
US 2022/0408571 A1    Dec. 22, 2022

(30) Foreign Application Priority Data

Jun. 21, 2021 (JP) .................. 2021-102410

(51) Int. Cl.
| | | |
|---|---|---|
| *B60R 16/02* | (2006.01) | |
| *H05K 5/02* | (2006.01) | |
| *B60R 16/023* | (2006.01) | |
| *H05K 7/20* | (2006.01) | |

(52) U.S. Cl.
CPC ....... *H05K 5/0204* (2013.01); *B60R 16/0239* (2013.01); *H05K 5/0247* (2013.01); *H05K 7/20845* (2013.01)

(58) Field of Classification Search
None
See application file for complete search history.

(56) References Cited

U.S. PATENT DOCUMENTS

| | | | |
|---|---|---|---|
| 9,252,523 B2* | 2/2016 | Tokunaga | ............ H01R 13/516 |
| 10,464,504 B2* | 11/2019 | Nakamura | .......... B60R 16/0215 |
| 11,027,679 B2* | 6/2021 | Yuki | ..................... H05K 5/0004 |
| 2011/0180339 A1* | 7/2011 | Kawamura | ............ B60L 1/003 |
| | | | 475/5 |
| 2019/0001802 A1* | 1/2019 | Shinkai | ..................... B60K 6/40 |
| 2019/0210447 A1 | 7/2019 | Brehmer et al. | |
| 2020/0017040 A1* | 1/2020 | Ishibashi | .................. H05K 5/03 |
| 2020/0070755 A1* | 3/2020 | Yuki | ........................ H05K 5/03 |
| 2020/0148136 A1 | 5/2020 | Takei | |
| 2020/0189379 A1* | 6/2020 | Hirukawa | ............ B62D 23/005 |
| 2020/0207220 A1* | 7/2020 | Yamanaka | ............ H01M 50/50 |
| 2021/0053623 A1* | 2/2021 | Shimokouchi | ........... B60K 1/00 |

FOREIGN PATENT DOCUMENTS

WO     2018/033346 A1    2/2018

* cited by examiner

*Primary Examiner* — Xanthia C Cunningham
(74) *Attorney, Agent, or Firm* — Oliff PLC

(57) ABSTRACT

An electric power device includes a power control unit that is fixed to an upper portion of an automatic transmission case, with a gap interposed between the power control unit and the automatic transmission case, and a battery that is connected to the power control unit by a first wire extending rearward in a vehicle front-rear direction from the power control unit.

6 Claims, 4 Drawing Sheets

ELECTRIC POWER DEVICE

CROSS-REFERENCE TO RELATED APPLICATION

This application claims priority to Japanese Patent Application No. 2021-102410 filed on Jun. 21, 2021, incorporated herein by reference in its entirety.

BACKGROUND

1. Technical Field

The disclosure relates to an electric power device including a power control unit capable of converting electric power from a battery.

2. Description of Related Art

WO 2018/033346 discloses a transmission for an automobile including a hydraulic transmission control device, a transmission housing, an oil pan attached to the transmission housing, and a power electronics device. The power electronics device is supported on the transmission housing and the oil pan, and the hydraulic transmission control device and the power electronics device are juxtaposed below or on the side of the transmission housing.

SUMMARY

In the technology disclosed in WO 2018/033346, the power electronics device is provided at a position at which the power electronics device is readily affected by heat from the transmission, and is difficult to replace.

The disclosure provides technology that suppresses effects of heat on a power control unit, and facilitates replacement of the power control unit.

An electric power device according to an aspect of the disclosure includes a power control unit that is fixed to an upper portion of an automatic transmission case, with a gap interposed between the power control unit and the automatic transmission case, and a battery that is connected to the power control unit by a first wire extending rearward in a vehicle front-rear direction from the power control unit.

According to the above aspect of the disclosure, technology that suppresses effects of heat on the power control unit and facilitates replacement of the power control unit can be provided.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
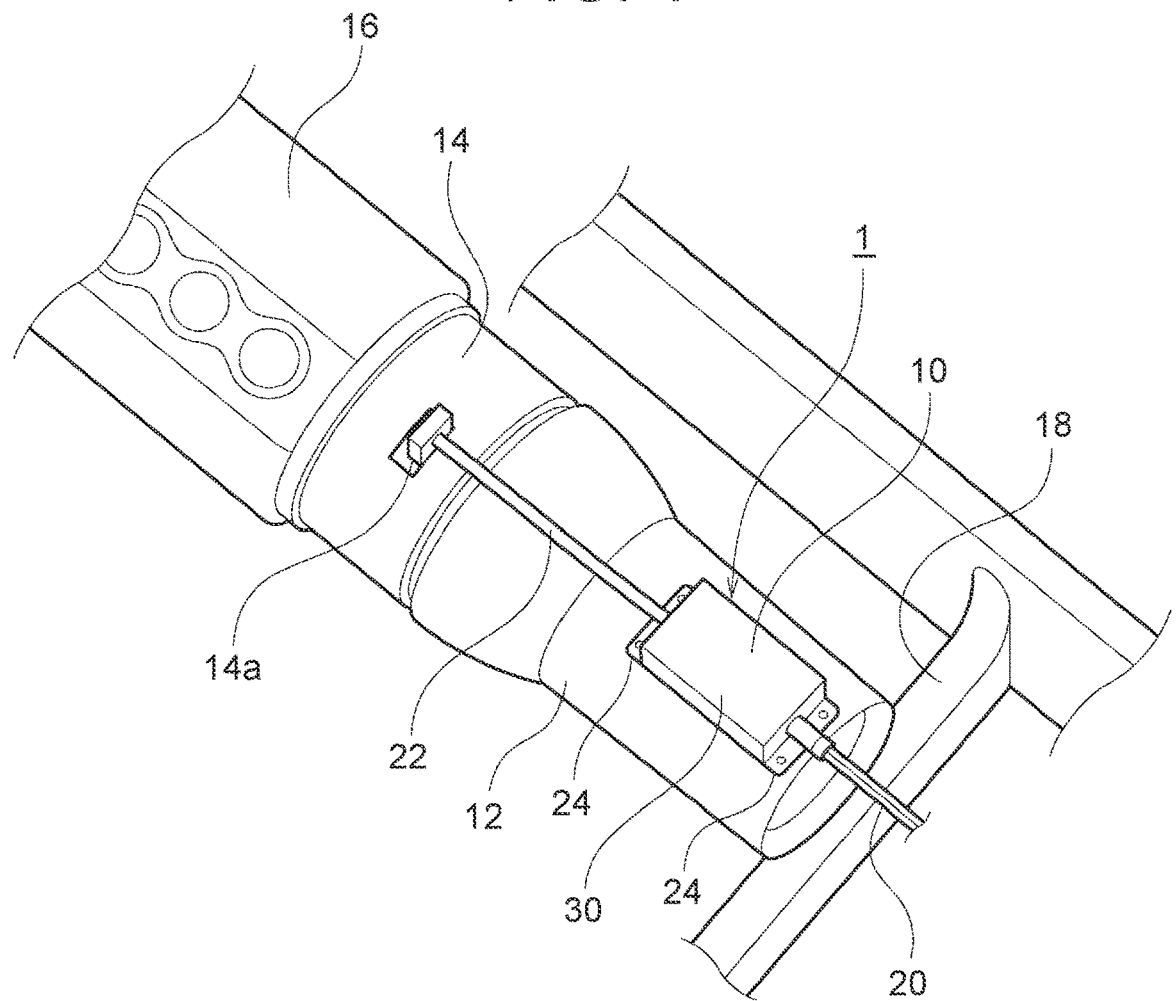
FIG. 1 is a perspective view of an electric power device according to an embodiment.

FIG. 1 is a perspective view of an electric power device 1 according to an embodiment. The electric power device 1 includes a power control unit 10, an automatic transmission case 12, a motor generator 14, a first wire 20, a second wire 22, and a battery that is omitted from illustration. The electric power device 1 is provided in a hybrid electric vehicle can travel in a motor driving mode and an engine driving mode. Note that a vehicle in which the electric power device 1 is provided is not limited to a hybrid electric vehicle, and the electric power device 1 may be provided in a battery electric vehicle that travels in a motor driving mode alone.

The automatic transmission case 12, the motor generator 14, and an engine 16 are arranged in a vehicle front-rear direction, with the engine 16 being located at a forefront side of the vehicle. Gears and so forth of the automatic transmission are installed inside the automatic transmission case 12. The automatic transmission case 12 is supported by a vehicle body frame 18. The automatic transmission is a stepped transmission that automatically shifts transmission stages according to vehicle speed, an accelerator operation amount (or a throttle valve opening degree), and so forth. The automatic transmission is connected to a rotation shaft of the motor generator 14 or the engine 16 via an input shaft, and is connected to right and left wheels via an output shaft.

The motor generator 14 functions as an electric motor that is rotationally driven by receiving electric power supplied from the battery (omitted from illustration). The motor generator 14 also functions as a generator when being rotated by an external force, and can charge the battery. A rotor, which is the rotation shaft of the motor generator 14, is connected to the input shaft of the automatic transmission. When driven, the motor generator 14 is controlled by the power control unit 10, based on control commands from a motor control unit. The motor generator 14 is disposed between the automatic transmission case 12 and the engine 16 in the vehicle front-rear direction, and is disposed forward of the automatic transmission case 12 in the vehicle front-rear direction.

The engine 16 is a gasoline engine or a diesel engine, and a valve opening degree of a throttle valve, and so forth, are controlled based on control commands from an engine control unit. The motor generator 14 and the engine 16 function as power units of the vehicle to generate driving force, and output the generated driving torque to the automatic transmission case 12 via the rotation shaft.

The power control unit 10 converts direct current electric power from the battery into alternating current electric power based on drive signals from an electric power control unit, and outputs the alternating current electric power to the motor generator 14. The power control unit 10 also converts alternating current electric power generated by regenerative electric power generation at the motor generator into direct current electric power, and outputs the direct current electric power to the battery, based on drive signals from the electric power control unit. The power control unit 10 includes an inverter and a converter, and can perform conversion between direct current on the battery side and three-phase alternating current on the motor generator 14 side.

The power control unit 10 has a case 30, brackets 24, and internal electrical equipment housed in the case 30. The internal electrical equipment includes the inverter, the converter, and electrical circuits. The power control unit 10 is fixed to an upper portion of the automatic transmission case 12, with a gap interposed between the power control unit 10 and the automatic transmission case 12. The case 30 keeps circuit boards and so forth from being exposed. The case 30 is provided with terminal openings into which the first wire 20 and the second wire 22 can be respectively inserted.

The brackets 24 are formed as a pair, so as to project from the bottom of the case 30 in the vehicle front-rear direction, and are formed so as to have flange shapes. The brackets 24 are used to fix the power control unit 10 to the automatic transmission case 12.

The power control unit 10 is connected to the battery by the first wire 20 and is connected to the motor generator 14 by the second wire 22. The first wire 20 extends rearward in the vehicle front-rear direction from the power control unit 10, and the second wire 22 extends forward in the vehicle front-rear direction from the power control unit 10. The first wire 20 and the second wire 22 are cables that are detachably inserted into the power control unit 10. This simplifies the layout of wiring to the motor generator 14 and the battery, facilitates connection to the power control unit 10, and suppresses contact with other devices, as compared to when the first wire and the second wire pass (i.e., extend) along the side of the automatic transmission case 12.

The motor generator 14 has a terminal block 14a provided at an upper portion of the motor generator 14, and the terminal block 14a is connected to the second wire 22 extending forward in the vehicle front-rear direction from the power control unit 10. Accordingly, the layout of the second wire 22 is simplified, and the motor generator 14 can be connected to the power control unit 10 disposed on the upper portion of the automatic transmission case 12 such that the distance between the motor generator 14 and the power control unit 10 is a short distance.

Figure 2:
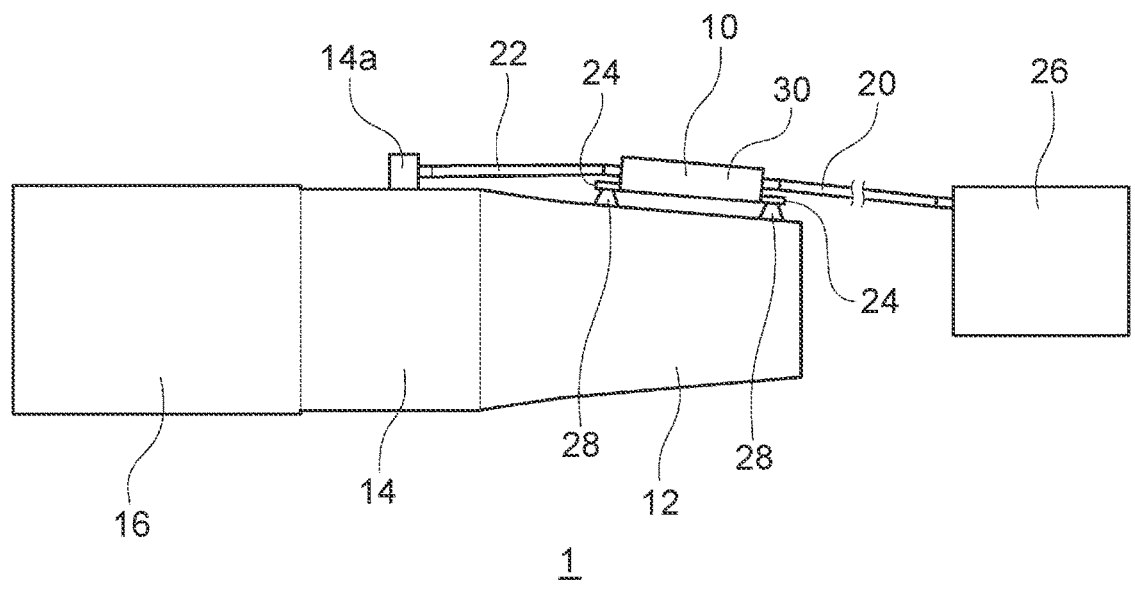
FIG. 2 is a side view of the electric power device according to the embodiment.

FIG. 2 is a side view of the electric power device 1 according to the embodiment. The automatic transmission case 12 has a pair of fastening seats 28 formed to be raised upward (i.e., a pair of fastening seats 28 formed to protrude upward). Each fastening seat 28 has a seat face on which one bracket 24 is seated, and an internal thread for fastening. The fastening seats 28 are formed by die-casting so as to be raised upward, and performing cutting to form the internal threads therein. The fastening seats 28 are disposed facing each other in the vehicle front-rear direction. The fastening seats 28 rise upward from the upper face of the automatic transmission case 12 by several centimeters, for example.

The brackets 24 of the power control unit 10 are seated on the fastening seats 28 and fastened by screws. Thus, the power control unit 10 alone can be easily attached and detached, and can be easily removed when the power control unit 10 fails. Further, by forming the fastening seats 28 raised upward, the gap is formed between the case 30 of the power control unit 10 and automatic transmission case 12, and the boards and the like inside the case 30 can be kept from being readily heated by the automatic transmission case 12. Further, disposing the power control unit 10 on the upper portion of the automatic transmission case 12 suppresses interference with other devices, such as a hydraulic transmission control device disposed on the side of the automatic transmission case 12.

The automatic transmission case 12 is tapered rearward in the vehicle front-rear direction, and the upper portion of the automatic transmission case 12 is disposed to be inclined downward, in a direction toward a vehicle-rearward side. The power control unit 10 is inclined in accordance with the incline of the upper portion of the automatic transmission case 12 and is inclined downward, in the direction toward the vehicle-rearward side. Accordingly, interference with other parts can be suppressed even though the power control unit 10 is disposed on the upper portion of the automatic transmission case 12.

A battery 26 is a rechargeable direct current electric power source, and for example is a secondary battery. The battery 26 supplies electric power to the power control unit 10, and is charged by receiving regenerative electric power output from the power control unit 10. The battery 26 is connected to the power control unit 10 by the first wire 20 extending rearward in the vehicle front-rear direction from the power control unit 10. Thus, the first wire 20 can be restrained from coming into contact with other devices as compared to when the first wire 20 passes (i.e., extends) along the side or the like of the automatic transmission case 12.

Figure 3:
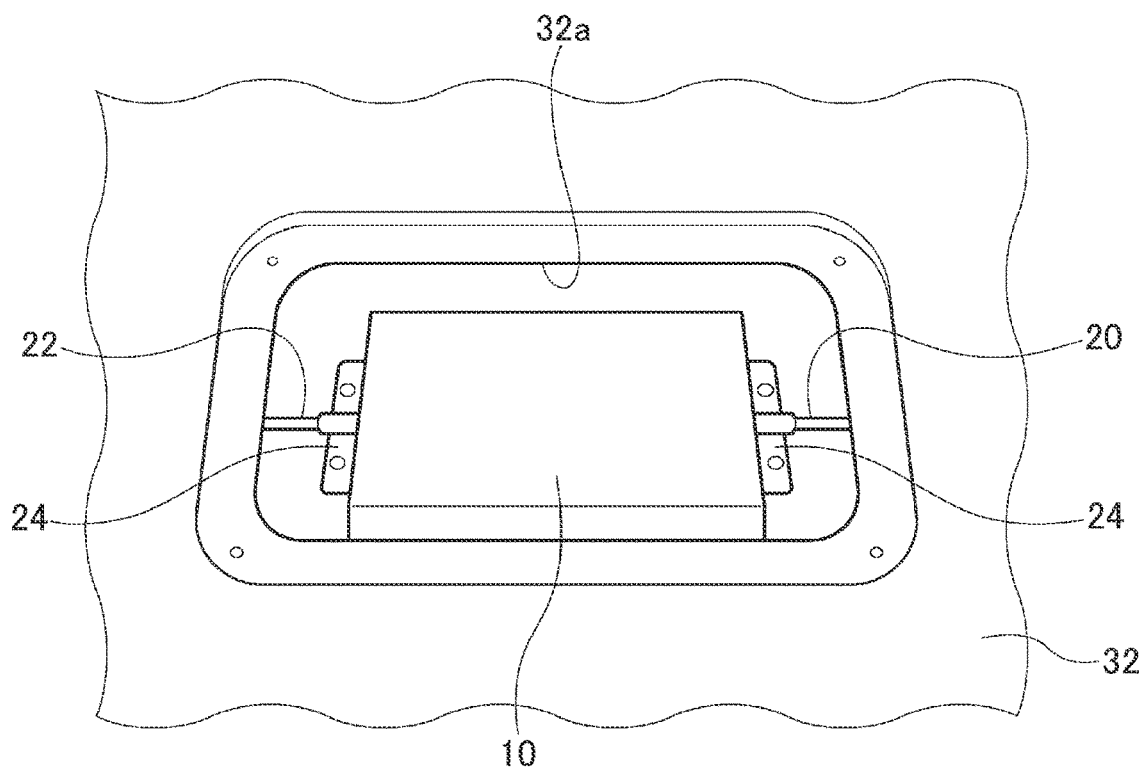
FIG. 3 is a diagram illustrating removal of a power control unit.

FIG. 3 is a diagram illustrating removal of the power control unit 10. The power control unit 10 is disposed below a vehicle body panel 32, and is covered by the vehicle body panel 32. The vehicle body panel 32 is provided with an opening 32a larger than the power control unit 10, and FIG. 3 illustrates a state in which the opening 32a is open. The opening 32a is normally closed by a lid (omitted from illustration), but the lid is removed and the opening 32a is opened when the power control unit 10 is to be removed.

After removing the lid, a worker extracts the terminals of the first wire 20 and the second wire 22 from the power control unit 10, unfastens the brackets 24 using a tool, detaches the power control unit 10 from the automatic transmission case 12, and extracts the power control unit 10 through the opening 32a. When replacing the power control unit 10, the worker can easily attach a new power control unit 10 by inserting the power control unit 10 through the opening 32a, fastening the brackets 24, and connecting the first wire 20 and the second wire 22 to the power control unit 10. As described above, the power control unit 10 does not have a structure in which the automatic transmission case 12, the motor generator 14, and the entire engine 16 need to be displaced in order to remove the power control unit 10, and the power control unit 10 alone can be easily replaced.

Figure 4:
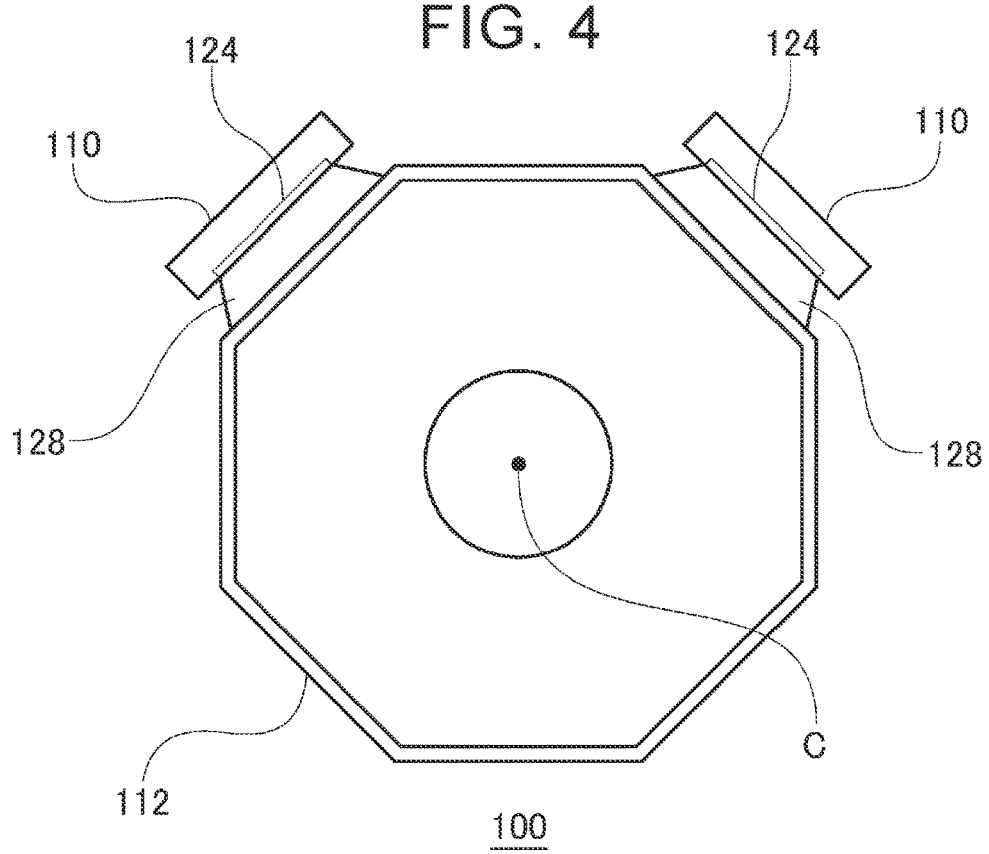
FIG. 4 is a rear view of an electric power device according to a first modification.

FIG. 4 is a rear view of an electric power device 100 according to a first modification. FIG. 4 illustrates the electric power device 100 as viewed from a vehicle-rearward side. A pair of power control units 110 is provided on an upper portion of an automatic transmission case 112. Brackets 124 are seated and fastened to fastening seats 128 formed to be raised upward on the upper portion of the automatic transmission case 112, whereby the power control units 110 are fixed to the automatic transmission case 112 with a gap interposed therebetween.

The power control units 110 are located upward from a center C of the automatic transmission case 112. This facilitates removal of the power control units 110 as compared with disposing the power control units on side faces of the automatic transmission case 112. Although FIG. 4 illustrates a form in which the power control units 110 are provided as a pair, this form is not limiting, and an arrangement may be made in which just one power control unit 110 is provided. In either case, the power control unit(s) 110 is/are fixed to the fastening seat(s) 128 at the upper portion of the automatic transmission case 112.

Figure 5:
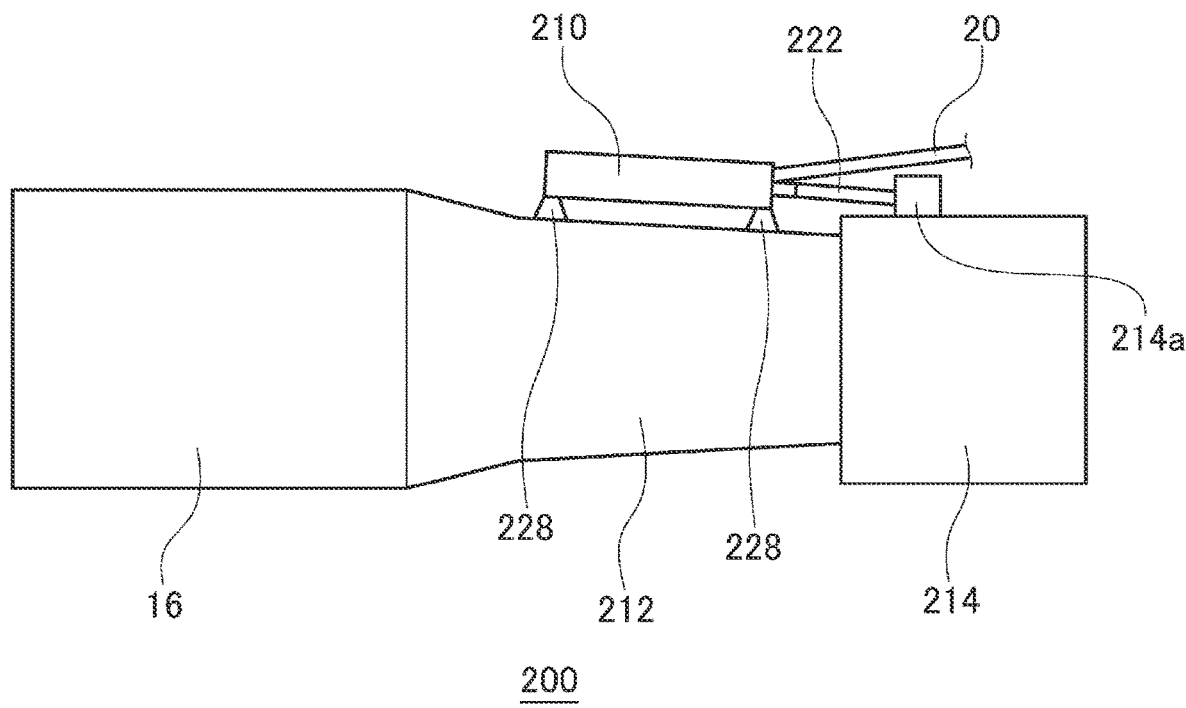
FIG. 5 is a side view of an electric power device according to a second modification.

FIG. 5 is a side view of an electric power device 200 according to a second modification. In the electric power device 200 according to the second modification, the positions of an automatic transmission case 212 and a motor generator 214 are different from those of the electric power device 1 illustrated in FIG. 2. This difference occurs depending on the vehicle model. The automatic transmission case 212 is situated rearward of the engine 16 in the vehicle front-rear direction, and is situated forward of the motor generator 214 in the vehicle front-rear direction, with the engine 16, the automatic transmission case 212, and the motor generator 214 being disposed in succession in that order.

A power control unit 210 is seated and fastened to fastening seats 228 formed to be raised upward on an upper portion of the automatic transmission case 212, whereby the power control unit 210 is fixed to the automatic transmission case 212 with a gap interposed therebetween.

The motor generator 214 has a terminal block 214a on an upper portion thereof. The motor generator 214 is located rearward of the power control unit 210, and accordingly a second wire 222 extends from the power control unit 210 rearward in the vehicle front-rear direction and is connected to the terminal block 214a.

Figure 6:
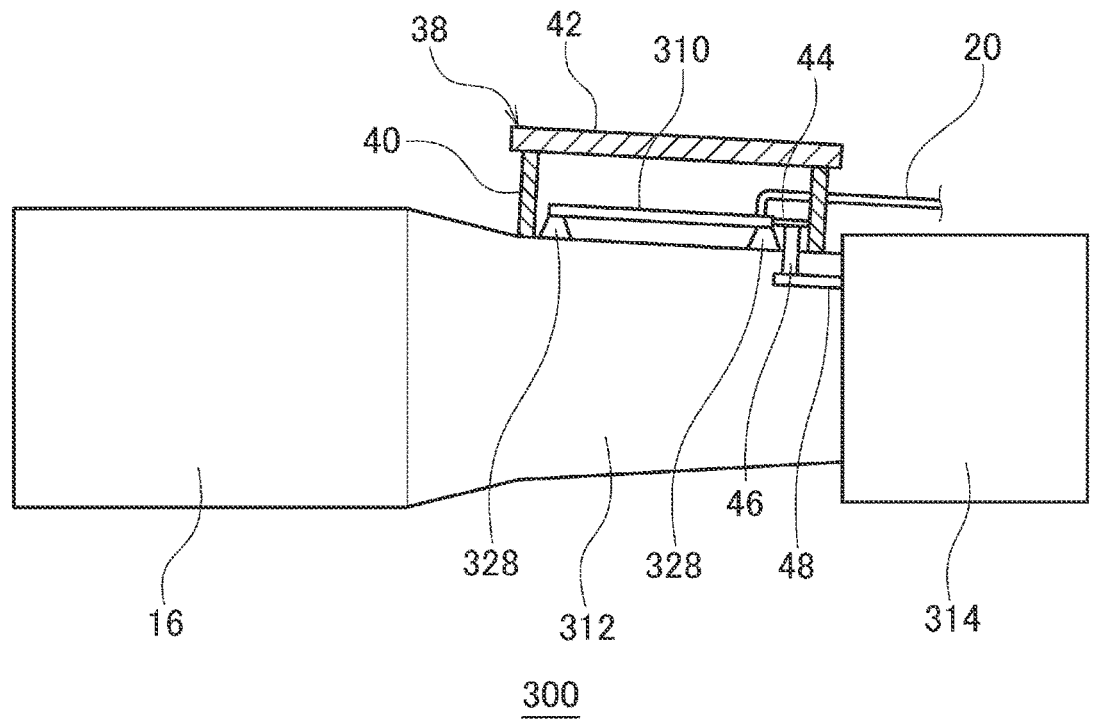
FIG. 6 is a side view of an electric power device according to a third modification.

FIG. 6 is a side view of an electric power device 300 according to a third modification. The electric power device 300 according to the third modification has a different protection method for a power control unit 310 and a different connection method for the power control unit 310 and a motor generator 314, as compared with the electric power device 200 illustrated in FIG. 5. The power control unit 310 and the motor generator 314 are connected using bus bars.

The power control unit 310 is seated and fastened to fastening seats 328 formed to be raised upward on an upper portion of an automatic transmission case 312, whereby the power control unit 310 is fixed to the automatic transmission case 312 with a gap interposed therebetween.

The power control unit 310 does not have a case, and a board is directly fixed to the fastening seats 328 of the automatic transmission case 312. An accommodating portion 38 is provided on the upper portion of the automatic transmission case 312, and the fastening seats 328 are provided in the accommodating portion 38. The accommodating portion 38 has side wall portions 40 erected from the upper face of the automatic transmission case 312, and a lid portion 42 capable of opening and closing an upper opening defined by the side wall portions 40. The side wall portions 40 form a rectangular space. The lid portion 42 is engaged with the side wall portions 40 in a state in which the upper opening defined by the side wall portions 40 is closed. The lid portion 42 may be engaged with the side wall portions 40 by screws, or may be engaged by an engaging claw.

The power control unit 310 and the motor generator 314 are electrically connected by a first bus bar 44, an intermediate terminal block 46, and a second bus bar 48. Costs can be reduced by connecting the power control unit 310 and the motor generator 314 by bus bars as compared to connecting the power control unit 310 and the motor generator 314 by cables.

The intermediate terminal block 46 is fixed to the upper side of the automatic transmission case 312. At least an upper end portion of the intermediate terminal block 46 is provided within the accommodating portion 38, and the entire intermediate terminal block 46 may be provided in the accommodating portion 38. The first bus bar 44 is electrically connected to the power control unit 310, projects rearward in the vehicle front-rear direction from the power control unit 310, and is connected to the upper end portion of the intermediate terminal block 46 by bolts, screws, or the like.

Although the motor generator 314 is not provided with a terminal block at an upper portion thereof, the second bus bar 48 projecting forward in the vehicle front-rear direction is assembled to the motor generator 314 and is electrically connected to the motor generator 314. The second bus bar 48 is linked to a lower end portion of the intermediate terminal block 46 by bolts, screws, or the like. The worker closes the lid portion 42 after linking the first bus bar 44 and the intermediate terminal block 46. Thus, the electrical contacts of the power control unit 310 can be protected.

Note that a cover may be provided to cover the intermediate terminal block 46 and the second bus bar 48. Also, the intermediate terminal block 46 and the second bus bar 48 may be integrally formed.

Figure 7:
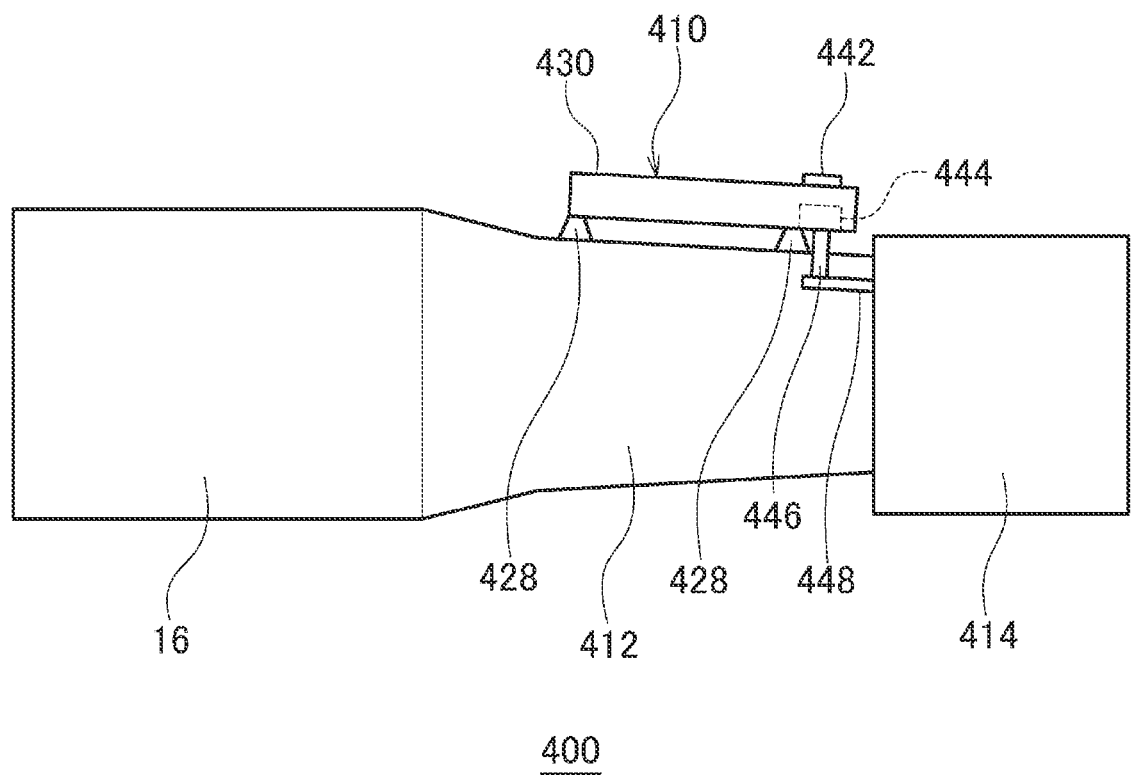
FIG. 7 is a side view of an electric power device according to a fourth modification.

FIG. 7 is a side view of an electric power device 400 according to a fourth modification. The electric power device 400 according to the fourth modification has a different connection method for a power control unit 410 and a motor generator 414, as compared with the electric power device 200 illustrated in FIG. 5. The power control unit 410 and a motor generator 414 are connected using bus bars.

A case 430 of the power control unit 410 is fastened to fastening seats 428 formed to be raised upward on an upper portion of an automatic transmission case 412, whereby the power control unit 410 is fixed to the automatic transmission case 412 with a gap interposed therebetween.

The case 430 is provided with a tool hole and a lid portion 442 that closes the tool hole. The tool hole is formed to extend through the upper face of the case 430, and is formed at a position such that the tool can reach a first bus bar 444. The first bus bar 444 is disposed within the case 430, and is electrically connected to the power control unit 410.

An intermediate terminal block 446 is fixed to the automatic transmission case 412, and an upper end portion of the intermediate terminal block 446 is inserted into the case 430. A second bus bar 448 is electrically connected to the motor generator 414, projects forward in the vehicle front-rear direction from the motor generator 414, and is connected to a lower end portion of the intermediate terminal block 446. The lower end portion of the intermediate terminal block 446 and the second bus bar 448 may be covered by a cover.

It should be noted that the embodiment is only exemplary, and it will be understood by those skilled in the art that various modifications can be made to combinations of the components, and that such modifications are also within the scope of the disclosure.

What is claimed is:

1. An electric power device comprising:
   a power control unit that is fixed to an upper portion of an automatic transmission case, with a gap interposed between the power control unit and the automatic transmission case; and
   a battery that is connected to the power control unit by a first wire extending rearward in a vehicle front-rear direction from the power control unit.

2. The electric power device according to claim 1, wherein the automatic transmission case is provided with a fastening seat configured to fasten the power control unit, the fastening seat being raised upward on the upper portion of the automatic transmission case.

3. The electric power device according to claim 2, wherein the power control unit includes a bracket projecting in a flange shape, and the bracket is seated on the fastening seat and fastened.

4. The electric power device according to claim 1, wherein:
   the power control unit is connected to a motor generator;

the motor generator is disposed forward of the automatic transmission case in the vehicle front-rear direction; and the motor generator is connected to the power control unit by a second wire extending forward in the vehicle front-rear direction from the power control unit.

5. The electric power device according to claim 4, wherein:

the motor generator includes a terminal block provided at an upper portion of the motor generator; and the terminal block is connected to the second wire.

6. The electric power device according to claim 1, wherein:

the power control unit is disposed under a vehicle body panel; and the vehicle body panel has an opening from which the power control unit is extractable.

* * * * *